United States Patent

Shim et al.

[11] Patent Number: 6,165,870
[45] Date of Patent: Dec. 26, 2000

[54] ELEMENT ISOLATION METHOD FOR SEMICONDUCTOR DEVICES INCLUDING ETCHING IMPLANTED REGION UNDER SAID SPACER TO FORM A STEPPED TRENCH STRUCTURE

[75] Inventors: Hyun Woong Shim; Bon Seong Koo, both of Kyoungki-do, Rep. of Korea

[73] Assignee: Hyundai Electronics Industries Co., Ltd., Ichon-shi, Rep. of Korea

[21] Appl. No.: 09/342,501

[22] Filed: Jun. 29, 1999

[30] Foreign Application Priority Data

Jun. 30, 1998 [KR] Rep. of Korea .................. 98-25997

[51] Int. Cl.⁷ .................. H01L 21/76; H01L 21/38; H01L 21/302; H01L 21/461

[52] U.S. Cl. .................. 438/424; 438/433; 438/555; 438/704

[58] Field of Search .................. 438/424, 433, 438/555, 704

[56] References Cited

U.S. PATENT DOCUMENTS

| | | |
|---|---|---|
| 4,534,824 | 8/1985 | Chen . |
| 5,598,019 | 1/1997 | Komori et al. . |
| 5,780,340 | 7/1998 | Gardner et al. . |
| 5,780,353 | 7/1998 | Omid-Zohoor . |
| 5,858,857 | 1/1999 | Ho . |
| 6,001,707 | 12/1999 | Liu et al. . |
| 6,008,129 | 12/1999 | Graff et al. . |

*Primary Examiner*—John F. Niebling
*Assistant Examiner*—Ron Pompey
*Attorney, Agent, or Firm*—Jacobson, Price, Holman & Stern, PLLC

[57] ABSTRACT

An element isolation method, in particular, a shallow trench isolation (STI) method for semiconductor devices is disclosed in which a trench is formed to have a stepped structure shaped in such a fashion that it has a smaller width at its lower portion than at its upper portion. This stepped trench structure, which includes at least one step, is capable of obtaining an increased metal contact margin, thereby preventing metal contacts from being short-circuited with wells due to a misalignment thereof.

12 Claims, 6 Drawing Sheets

ELEMENT ISOLATION METHOD FOR SEMICONDUCTOR DEVICES INCLUDING ETCHING IMPLANTED REGION UNDER SAID SPACER TO FORM A STEPPED TRENCH STRUCTURE

BACKGROUND OF THE INVENTION

1. Field of the Invention

The present invention relates to an element isolation method for semiconductor devices, and more particularly to a shallow trench isolation (STI) method using a shallow trench according to the design rule for highly integrated semiconductor devices.

2. Description of the Related Art

Generally, the STI process is known as an element isolation technique, which is currently regared as an efficient process for semiconductor devices, in that it advantageously involves no bird's beak effect while providing a vertical element isolation capable of completely isolating elements from one another.

In conventional STI processes, however, where misaligned metal contacts are formed, the misaligned metal contacts may be short-circuited with wells in spite of a plug ion implantation, thereby resulting in a failure.

This is because a vertical STI structure is formed in accordance with conventional STI processes. Where such a vertical STI structure is formed, a possible misalignment of metal contacts results in the absence of doping of desired ions on the surface of a polysilicon substrate at regions where the metal contacts have vertical edges laterally spaced from the polysilicon surface in a plug implantation process. That is, although an implantation of $N^+$ ions is conducted for a structure in which metal contacts are misaligned, as shown in FIG. 1, portions of the structure indicated by circles D in FIG. 1 are not doped with $N^+$ ions so that those metal contacts may be short-circuited with P-wells.

In order to avoid such a phenomenon, therefore, it is necessary to obtain an increased metal contact margin in the STI process.

SUMMARY OF THE INVENTION

The present invention has been made in view of the above-mentioned problems involved in the prior art, and an objective of the invention is to provide an element isolation method for semiconductor devices which is capable of obtaining an increased metal contact margin, thereby preventing metal contacts from being short-circuited with wells due to a misalignment thereof.

In accordance with one aspect of the present invention, the method for fabricating an element isolation structure in a semiconductor device comprises the steps of: forming a pad oxide film over a semiconductor substrate; forming a nitride film pattern over said semiconductor substrate except for a portion will be formed an element insulating film; forming spacers at side walls of the nitride film pattern; implanting ions into said semiconductor substrate disposed beneath said pad oxide film exposed between said side walls using said spacers and said nitride film pattern as a mask, thereby forming an ion-implanted region; selectively removing said pad oxide film, said ion-implanted region, and said semiconductor substrate using said nitride film pattern and said spacer as a mask, thereby forming a trench in said semiconductor substrate; removing said ion-implanted region remaining after said selective removal thereof; forming a trench oxide film over the entire exposed surface of the resulting structure obtained after said removal of said ion-implanted region, thereby filling the trench; and selectively removing said trench oxide film and said spacers in accordance with a blanket etching process, thereby forming an element isolating film.

In accordance with another aspect of the present invention, the method for fabricating an element isolation structure in a semiconductor device comprises the steps of providing a semiconductor substrate; sequentially forming a pad oxide film and a nitride film over said semiconductor substrate; forming a photoresist film pattern over said nitride film, and selectively removing said nitride film by using said nitride film as a mask, thereby forming a nitride film pattern; removing said photoresist film pattern, and then forming spacers at the side walls of said nitride film pattern; implanting ions in a portion of said semiconductor substrate disposed beneath an exposed portion of said pad oxide film between said side walls by using said spacers and said nitride film pattern as a mask, thereby forming an ion-implanted region; selectively removing said pad oxide film, said ion-implanted region, and said semiconductor substrate by using said nitride film pattern and said spacers as a mask, thereby forming a trench in said semiconductor substrate; removing said ion-implanted region remaining after said selective removal thereof; forming a trench oxide film over the entire exposed surface of the resulting structure obtained after said removal of said ion-implanted region, thereby filling said trench filed with said trench oxide film; selectively removing said trench oxide film and said spacers in accordance with an blanket etching process; further selectively removing said trench oxide film and said spacers; and removing said nitride film pattern and said pad oxide film, thereby forming an element isolation film.

BRIEF DESCRIPTION OF THE DRAWINGS

Other objectives and aspects of the invention will become apparent from the following description of embodiments with reference to the accompanying drawings in which.

DESCRIPTION OF THE PREFERRED EMBODIMENTS

Referring to FIGS. 3 to 12, an element isolation method, namely, a method for fabricating an element isolation structure in a semiconductor device in accordance with the present invention is illustrated.

Figure 3:
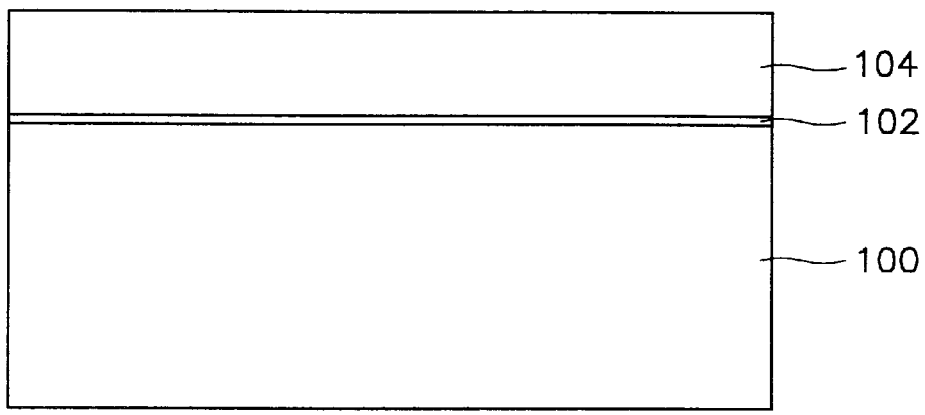
FIGS. 3 to 12 are sectional views respectively illustrating sequential steps of a method for fabricating an element isolation structure in a semiconductor device in accordance with the present invention.

In accordance with the element isolation method of the present invention, a pad oxide film 102 and a nitride film 104 are sequentially formed over a silicon substrate 100, as shown in FIG. 3.

Figure 4:
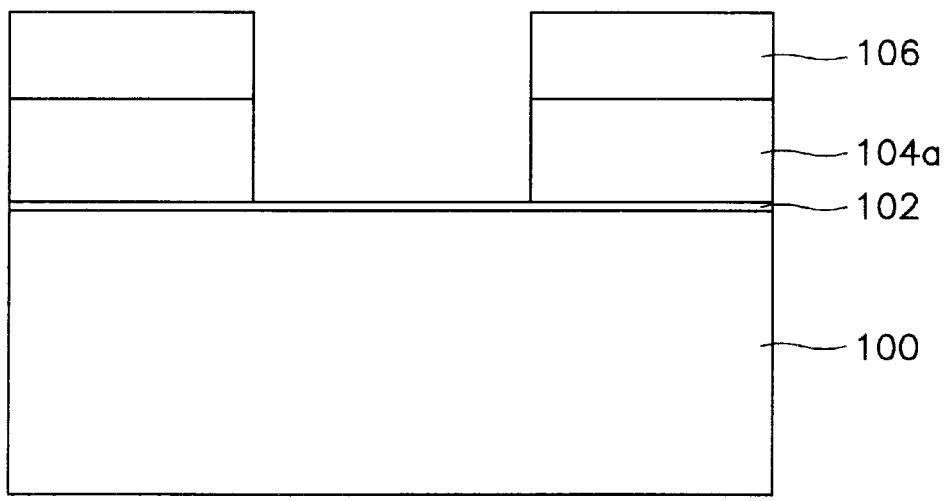

Thereafter, a photoresist film pattern 106 is coated over the nitride film 104, as shown in FIG. 4. Using the photoresist film pattern 106 as a mask, the nitride film 104 is then patterned, thereby forming a nitride film pattern 104a.

Figure 5:
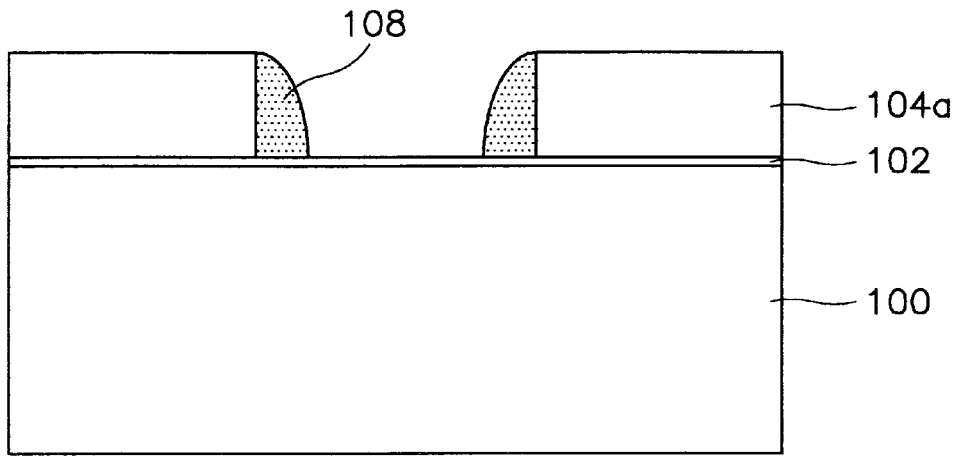

The photoresist film pattern 106 is then completely removed, as shown in FIG. 5, and an oxide film (not shown) is coated over the resulting structure. The oxide film is subsequently subjected to a blanket etch process, thereby forming spacers 108 at the side walls of the nitride film pattern 104a.

Figure 6:
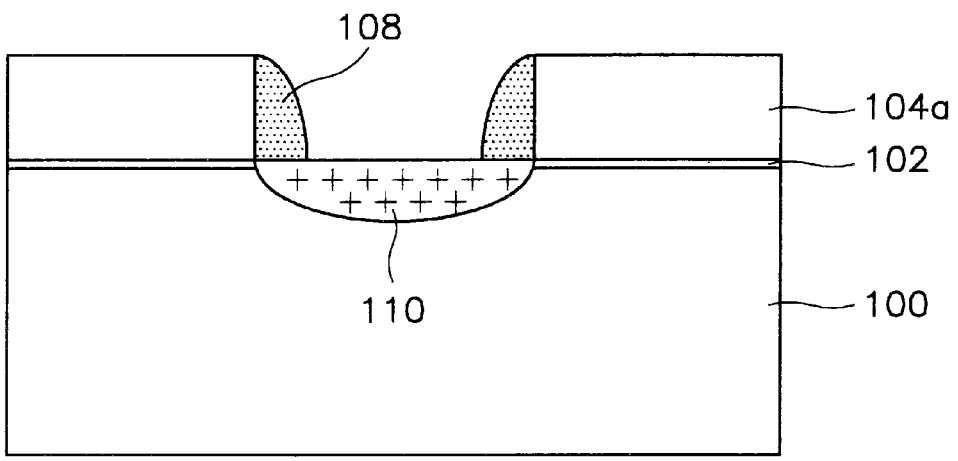
Figure 7:
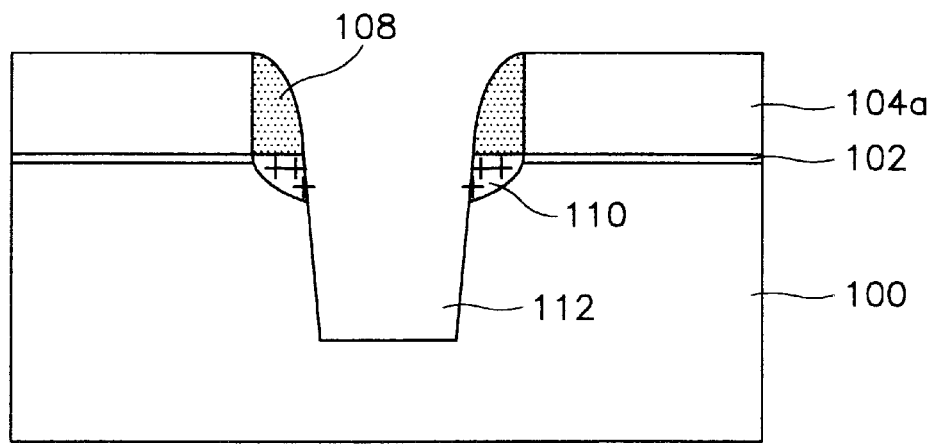

Using the spacers 108 as a mask, P ions are subsequently implanted in a region where the pad oxide film 102 is exposed. An annealing process is then conducted on the resulting structure, thereby forming a P ion doped region 110 in the silicon substrate 100, as shown in FIG. 6. The P ion doped region 110 extends laterally to portions of the silicon substrate 100 disposed beneath the spacers 108.

Again using the spacers 108 as a mask, the portions of the P ion doped region 110, pad oxide film 102 and polysilicon substrate 100 exposed between the spacers 108 are then sequentially etched, thereby forming an STI region 112. At this time, the P ion doped region 110 is partially left beneath the spacers 108.

Figure 8:
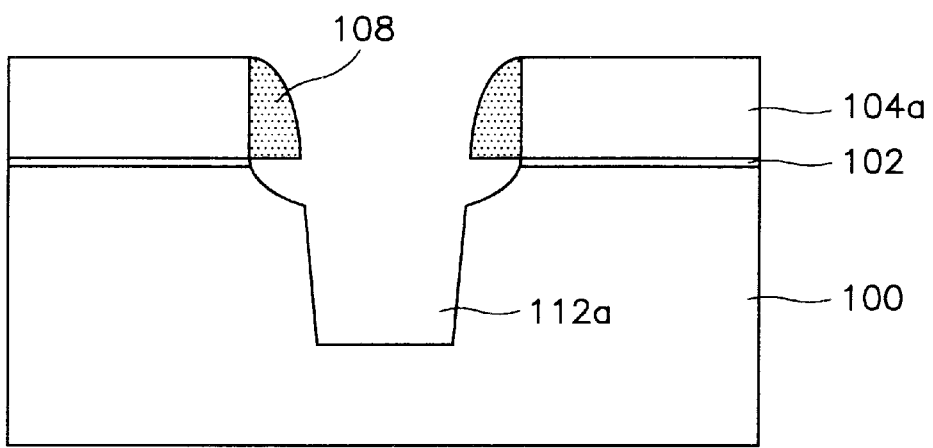

Thereafter, the P ion doped region 110 remaining beneath the spacers 108 is completed removed in accordance with a wet etch process. As a result, a trench 112a having a stepped structure is shaped in such a fashion that it has a smaller width at its lower portion than at its upper portion, as shown in FIG. 8.

Figure 9:
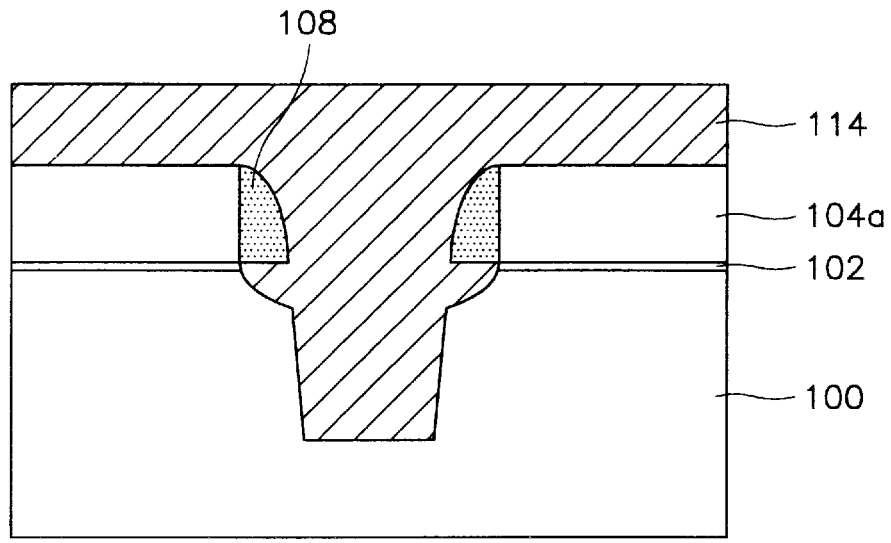

A trench oxide film 114 is then formed over the exposed surface of the resulting structure, having the trench 112a in such a fashion that it completely fills the trench 112a, as shown in FIG. 9. An annealing process is subsequently conducted for the resulting structure.

Figure 10:
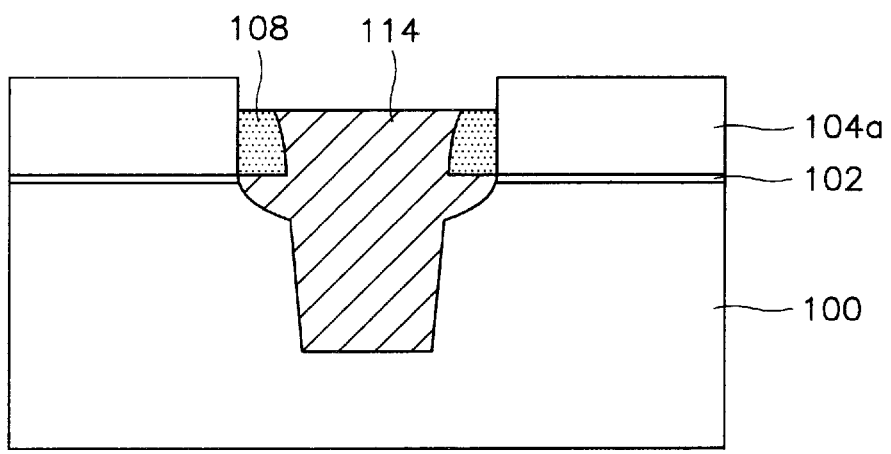

The trench oxide film 114 and spacers 108 are then etched under the condition in which the nitride film pattern 104a serves as an etch stopper, as shown in FIG. 10.

Figure 11:
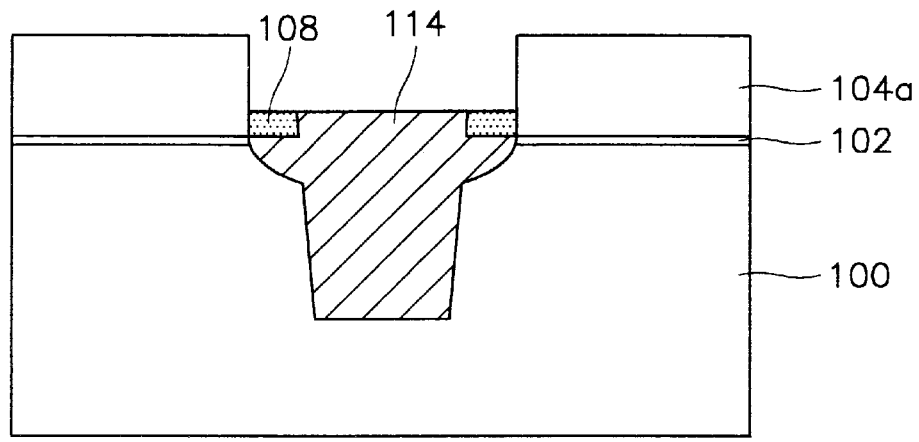

A wet etch process is then conducted in order to further etch the trench oxide film 114 and spacers 108 in such a fashion that they are left to a desired height over the trench 112a, as shown in FIG. 11.

Figure 12:
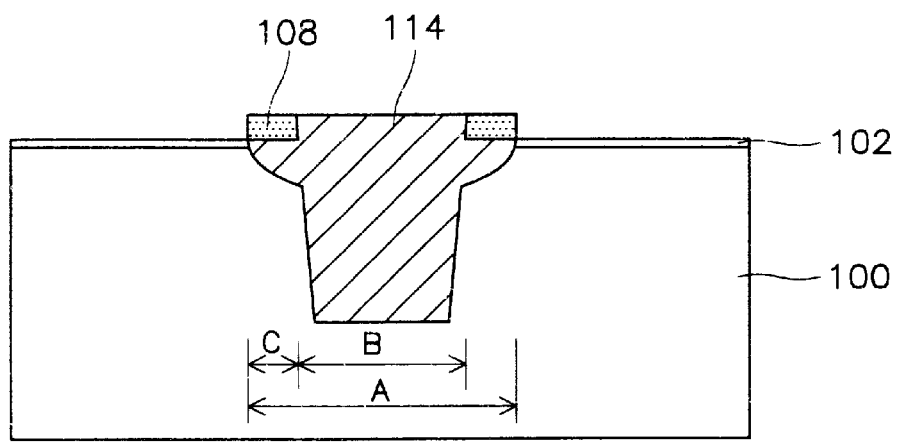

Then, the nitride film pattern 104 is completely removed, as shown in FIG. 12. For the resulting structure, a conventional element isolation process is conducted which involves the formation of a gate oxide film (not shown).

After the element isolation process, an element isolation structure is obtained which has a step formed between its upper and lower portions to have a width "C" corresponding to the difference between the widths "A" and "B" of those upper and lower portions.

Figure 1:
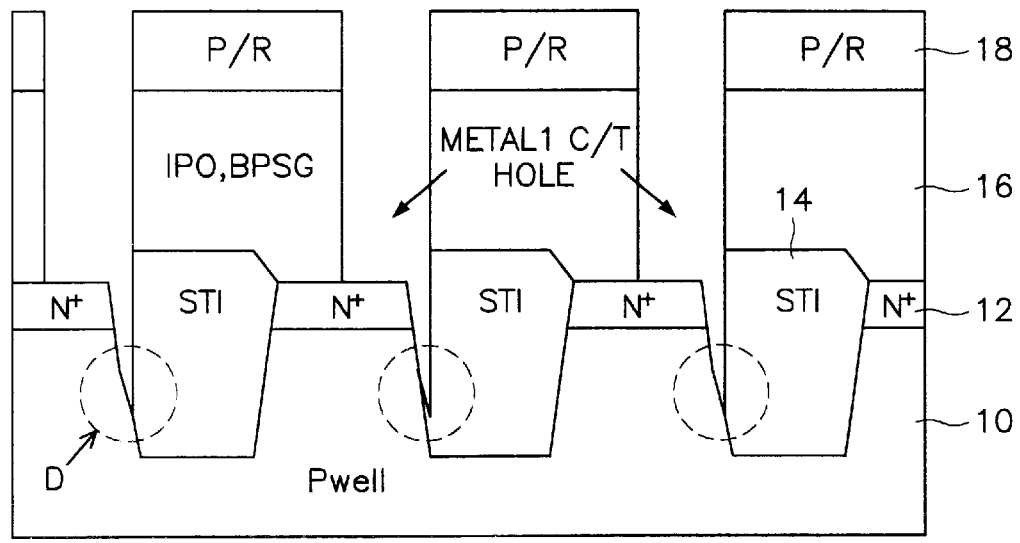
FIG. 1 is a sectional view illustrating a misaligned state of metal contacts fabricated in accordance with the prior art.
Figure 2:
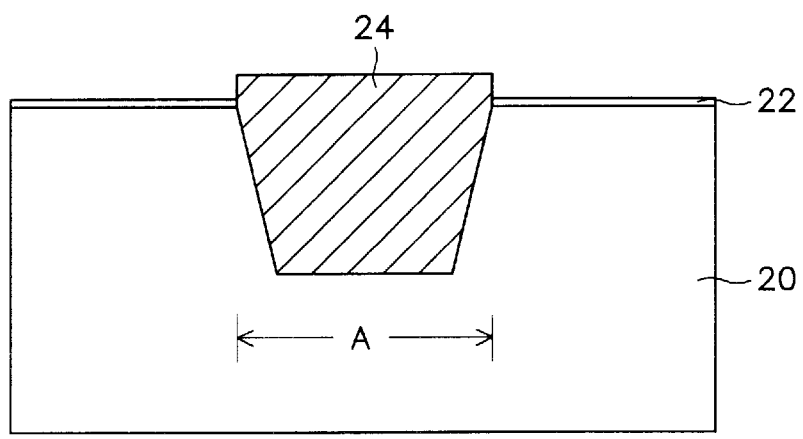
FIG. 2 is a sectional view illustrating an element isolation state of a semiconductor device fabricated in accordance with the prior art.

The element isolation structure formed in accordance with the present invention provides a contact margin increased by the width "C" of the step between its upper and lower portions, as compared to an element isolation structure of FIG. 2 formed in accordance with a conventional STI process.

Although the illustrated embodiment of the present invention has been described in conjunction with a trench structure having one step, the present invention may also be applied to a case in which a trench structure having two or more steps is formed.

As is apparent from the above description, the present invention provides an element isolation method for semiconductor devices in which a trench is formed in accordance with an STI process in such a fashion that it has a smaller width at its lower portion than at its upper portion by a desired width. By virtue of such a trench structure, an increased metal contact margin is obtained. Accordingly, it is possible to prevent metal contacts from being short-circuited with wells due to a misalignment thereof.

Although the preferred embodiments of the invention have been disclosed for illustrative purposes, those skilled in the art will appreciate that various modifications, additions and substitutions are possible, without departing from the scope and spirit of the invention, as disclosed in the accompanying claims.

What is claimed is:

1. A method for fabricating an element isolation structure in a semiconductor device, comprising the steps of:

forming a pad oxide film over a semiconductor substrate;

forming a nitride film pattern over said semiconductor substrate except for a portion will be formed an element insulating film;

forming spacers at side walls of the nitride film pattern;

implanting ions into said semiconductor substrate disposed beneath said pad oxide film exposed between said side walls using said spacers and said nitride film pattern as a mask, thereby forming an ion-implanted region;

selectively removing said pad oxide film, said ion-implanted region, and said semiconductor substrate using said nitride film pattern and said spacer as a mask, thereby forming a trench in said semiconductor substrate;

removing said ion-implanted region remaining after said selective removal thereof;

forming a trench oxide film over the entire exposed surface of the resulting structure obtained after said removal of said ion-implanted region, thereby filling the trench; and selectively removing said trench oxide film and said spacers in accordance with a blanket etching process, thereby forming an element isolating film.

2. The method as claimed in claim 1, further comprising the step of annealing the structure obtained after said ion implantation.

3. The method as claimed in claim 1, wherein said ion-implanted region extends laterally to portions of said semiconductor substrate disposed beneath said spacers.

4. The method as claimed in claim 1, wherein said step of removing said ion-implanted region remaining after said selective removal thereof is conducted using a wet etch process.

5. The method as claimed in claim 1, wherein said spacers are comprised of a silicon oxide film.

6. The method as claimed in claim 1, wherein said element isolation film is comprised of said trench oxide film and said spacers remaining after further said selective removal thereof.

7. A method for fabricating an element isolation structure in a semiconductor device, comprising the steps of:

providing a semiconductor substrate;

sequentially forming a pad oxide film and a nitride film over said semiconductor substrate;

forming a photoresist film pattern over said nitride film, and selectively removing said nitride film by using said nitride film as a mask, thereby forming a nitride film pattern;

removing said photoresist film pattern, and then forming spacers at the side walls of said nitride film pattern;

implanting ions in a portion of said semiconductor substrate disposed beneath an exposed portion of said pad oxide film between said side walls by using said spacers and said nitride film pattern as a mask, thereby forming an ion-implanted region;

selectively removing said pad oxide film, said ion-implanted region, and said semiconductor substrate by using said nitride film pattern and said spacers as a mask, thereby forming a trench in said semiconductor substrate;

removing said ion-implanted region remaining after said selective removal thereof;

forming a trench oxide film over the entire exposed surface of the resulting structure obtained after said removal of said ion-implanted region, thereby filling said trench with said trench oxide film;

selectively removing said trench oxide film and said spacers in accordance with an blanket etching process;

further selectively removing said trench oxide film and said spacers; and removing said nitride film pattern and said pad oxide film, thereby forming an element isolation film.

8. The method as claimed in claim 7, further comprising the step of annealing the structure obtained after said ion implantation.

9. The method as claimed in claim 7, wherein said ion-implanted region extends laterally to portions of said semiconductor substrate disposed beneath said spacers.

10. The method as claimed in claim 7, wherein said step of removing said ion-implanted region remaining after said selective removal thereof is conducted using a wet etch process.

11. The method as claimed in claim 7, wherein said spacers are comprised of a silicon oxide film.

12. The method as claimed in claim 7, wherein said element isolation film is comprised of said trench oxide film and said spacers remaining after further said selective removal thereof.

* * * * *